US011380752B2

(12) United States Patent
Zhao et al.

(10) Patent No.: US 11,380,752 B2
(45) Date of Patent: Jul. 5, 2022

(54) STRETCHABLE DISPLAY PANEL, DISPLAY APPARATUS, AND METHOD OF FABRICATING STRETCHABLE DISPLAY PANEL

(71) Applicant: BOE Technology Group Co., Ltd., Beijing (CN)

(72) Inventors: Jia Zhao, Beijing (CN); Fangxu Cao, Beijing (CN); Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 182 days.

(21) Appl. No.: 16/771,578

(22) PCT Filed: Aug. 22, 2019

(86) PCT No.: PCT/CN2019/102001
§ 371 (c)(1),
(2) Date: Jun. 10, 2020

(87) PCT Pub. No.: WO2021/031188
PCT Pub. Date: Feb. 25, 2021

(65) Prior Publication Data
US 2021/0408204 A1    Dec. 30, 2021

(51) Int. Cl.
*H01L 27/32* (2006.01)
*H01L 25/16* (2006.01)
(Continued)

(52) U.S. Cl.
CPC ........ *H01L 27/3276* (2013.01); *H01L 25/167* (2013.01); *H01L 51/0097* (2013.01);
(Continued)

(58) Field of Classification Search
None
See application file for complete search history.

(56) References Cited

U.S. PATENT DOCUMENTS 9,306,180 B2 *   4/2016  Kim ................... H01L 27/3244
10,466,746 B2 *  11/2019 Hong .................... G06F 1/1626
(Continued)

FOREIGN PATENT DOCUMENTS

CN    107994052 A    5/2018
CN    108933148 A    12/2018
(Continued)

OTHER PUBLICATIONS

Machine translation of WO 2021/020750 (Year: 2021).*
International Search Report & Written Opinion dated May 14, 2020, regarding PCT/CN2019/102001.

*Primary Examiner* — J. E. Schoenholtz
(74) *Attorney, Agent, or Firm* — Intellectual Valley Law, P.C.

(57) ABSTRACT

A stretchable display panel is provided. The stretchable display panel includes a plurality of encapsulated islands; and a plurality of bridges connecting the plurality of encapsulated islands. A respective one of the plurality of bridges connects two adjacent encapsulated islands of the plurality of encapsulated islands along an extension direction from a first one of the two adjacent encapsulated islands to a second one of the two adjacent encapsulated islands. The respective one of the plurality of bridges includes a plurality of first parts and a plurality of second parts alternately arranged. The stretchable display panel includes an insulating layer. The insulating layer includes a plurality of insulating blocks respectively in the plurality of first parts. The insulating layer is at least partially absent in the respective one of the plurality of second parts.

17 Claims, 6 Drawing Sheets

(51) Int. Cl.
*H01L 51/00* (2006.01)
*H01L 51/56* (2006.01)

(52) U.S. Cl.
CPC ........ *H01L 51/56* (2013.01); *H01L 2227/323* (2013.01); *H01L 2251/5338* (2013.01)

(56) References Cited

U.S. PATENT DOCUMENTS

| | | |
|---|---|---|
| 2016/0049602 A1 | 2/2016 | Kim |
| 2016/0268352 A1 | 9/2016 | Hong et al. |
| 2018/0046221 A1 | 2/2018 | Choi et al. |
| 2018/0114825 A1 | 4/2018 | Hong et al. |
| 2019/0280077 A1* | 9/2019 | Park .................... H01L 27/3262 |

FOREIGN PATENT DOCUMENTS

| | | | |
|---|---|---|---|
| CN | 109935730 A | 6/2019 | |
| WO | WO-2021020750 A1 * | 2/2021 | ............. H01L 27/12 |

* cited by examiner

STRETCHABLE DISPLAY PANEL, DISPLAY APPARATUS, AND METHOD OF FABRICATING STRETCHABLE DISPLAY PANEL

CROSS-REFERENCE TO RELATED APPLICATION

This application is a national stage application under 35 U.S.C. § 371 of International Application No. PCT/CN2019/102001, filed Aug. 22, 2019, the contents of which are incorporated by reference in the entirety.

TECHNICAL FIELD

The present invention relates to display technology, more particularly, to a stretchable display panel, a display apparatus, and a method of fabricating a stretchable display panel.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the present invention provides a stretchable display panel, comprising a plurality of encapsulated islands; and a plurality of bridges connecting the plurality of encapsulated islands; wherein a respective one of the plurality of bridges connects two adjacent encapsulated islands of the plurality of encapsulated islands along an extension direction from a first one of the two adjacent encapsulated islands to a second one of the two adjacent encapsulated islands; the respective one of the plurality of bridges comprises a plurality of first parts and a plurality of second parts alternately arranged; a respective one of the plurality of first parts extends along the extension direction; a respective one of the plurality of second parts extends along the extension direction; wherein the stretchable display panel comprises an insulating layer; the insulating layer comprises a plurality of insulating blocks respectively in the plurality of first parts; and the insulating layer is at least partially absent in the respective one of the plurality of second parts.

Optionally, the stretchable display panel further comprises a plurality of signal lines extending through the respective one of the plurality of bridges.

Optionally, at least one of the plurality of first parts comprises at least one of the plurality of signal lines on a respective one of the plurality of insulating blocks.

Optionally, at least one of the plurality of second parts comprises at least one of the plurality of signal lines.

Optionally, the plurality of signal lines are limited in the plurality of first parts; and the plurality of second parts are absent of the plurality of signal lines.

Optionally, a respective one of the plurality of first parts has a width of a cross-section along a plane intersecting the plurality of first parts and the plurality of second parts; and a ratio of the width to a thickness of the respective one of the plurality of first parts is in a range of 1:5 to 5:1.

Optionally, the ratio of the width to the thickness is in a range of 1:1.5 to 1.5:1.

Optionally, two adjacent insulating blocks respectively in two adjacent first parts of the plurality of first parts are spaced apart from each other by a spacing.

Optionally, the spacing is a groove; and the stretchable display panel comprises a flexible base substrate extending through regions corresponding to the plurality of first parts and the plurality of second parts.

Optionally, a respective one of the plurality of insulating blocks in the respective one of the plurality of first parts is in direct contact with the flexible base substrate; and a surface of the flexible base substrate forms a bottom of the groove.

Optionally, the respective one of the plurality of first parts further comprises at least a respective one of a plurality of second insulating blocks between the respective one of the plurality of insulating blocks and the flexible base substrate; the respective one of the plurality of insulating blocks in the respective one of the plurality of first parts is in direct contact with the respective one of the plurality of second insulating blocks; and a surface of the flexible base substrate forms a bottom of the groove.

Optionally, the spacing is a gap extending through an entire thickness of the respective one of the plurality of bridges; and the stretchable display panel is absent of any flexible base substrate in regions corresponding to the plurality of second parts.

Optionally, the respective one of the plurality of insulating blocks in the respective one of the plurality of first parts is in direct contact with the flexible base substrate.

Optionally, the respective one of the plurality of first parts further comprises at least a respective one of a plurality of second insulating blocks between the respective one of the plurality of insulating blocks and the flexible base substrate; and the respective one of the plurality of insulating blocks in the respective one of the plurality of first parts is in direct contact with the respective one of the plurality of second insulating blocks.

Optionally, the insulating layer is a part of a barrier layer extending from the plurality of encapsulated islands into the respective one of the plurality of bridges.

In another aspect, the present invention provides a display apparatus, comprising the stretchable display panel described herein or fabricated by a method described herein, and one or more integrated circuits connected to the stretchable display panel.

In another aspect, the present invention provides a method of fabricating a stretchable display panel, comprising forming a plurality of encapsulated islands; and forming a plurality of bridges connecting the plurality of encapsulated islands; wherein a respective one of the plurality of bridges is formed to connect two adjacent encapsulated islands of the plurality of encapsulated islands along an extension direction from a first one of the two adjacent encapsulated islands to a second one of the two adjacent encapsulated islands: forming the respective one of the plurality of bridges comprises forming a plurality of first parts and a plurality of second parts alternately arranged; a respective one of the plurality of first parts is formed to extend along the extension direction; a respective one of the plurality of second parts is formed to extend along the extension direction; wherein forming the stretchable display panel comprises forming an insulating layer; forming the insulating layer comprises forming a plurality of insulating blocks respectively in the plurality of first parts; and the insulating layer is at least partially absent in the respective one of the plurality of second parts.

Optionally, the method comprises forming a flexible base substrate on a support substrate; forming an insulating material layer on a side of the flexible base substrate away from the support substrate; forming a conductive material layer on a side of the insulating material layer away from the flexible base substrate; patterning the conductive material layer to form a plurality of signal lines in a region corresponding to the plurality of bridges, wherein a portion of the conductive material layer is removed in a region corresponding to a plurality of gaps respectively between adjacent bridges of the plurality of bridges; removing the insulating material layer in the region corresponding to the plurality of gaps; and patterning the insulating material layer to form the plurality of insulating blocks respectively in the plurality of first parts.

Optionally, patterning the conductive material layer is performed subsequent to forming an insulating material layer; and removing the insulating material layer in the region corresponding to the plurality of gaps and patterning the insulating material layer are performed subsequent to patterning the conductive material layer.

Optionally, forming the conductive material layer is performed subsequent to forming the insulating material layer, patterning the insulating material layer, and removing the insulating material layer in the region corresponding to the plurality of gaps.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
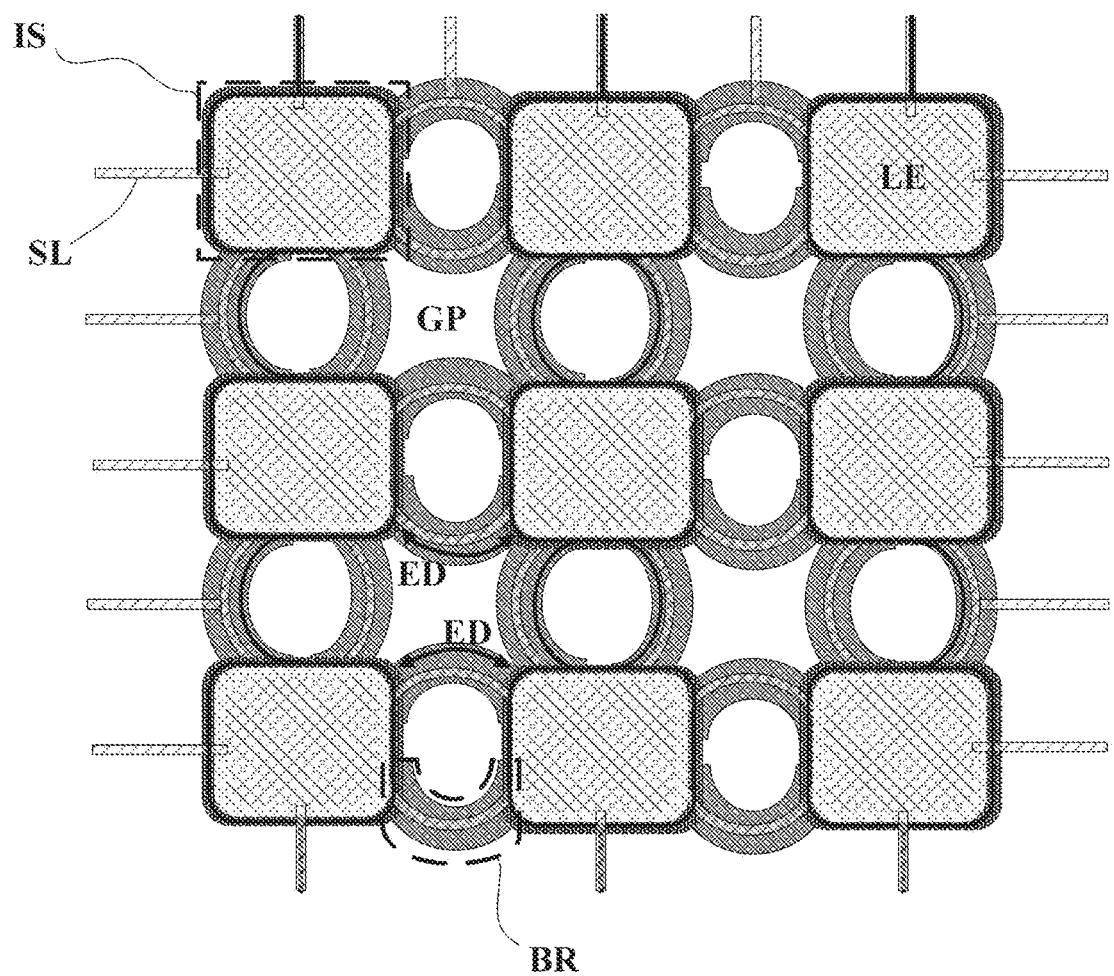
FIG. 1A is a schematic diagram illustrating the structure of a stretchable display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a stretchable display panel, a display apparatus, and a method of fabricating a stretchable display panel that substantially obviate one or more of the problems due to limitations and disadvantages of the related art. In one aspect, the present disclosure provides a stretchable display panel. In some embodiments, the stretchable display panel includes a plurality of encapsulated islands; and a plurality of bridges connecting the plurality of encapsulated islands. Optionally, a respective one of the plurality of bridges connects two adjacent encapsulated islands of the plurality of encapsulated islands along an extension direction from a first one of the two adjacent encapsulated islands to a second one of the two adjacent encapsulated islands. Optionally, the respective one of the plurality of bridges comprises a plurality of first parts and a plurality of second parts alternately arranged. Optionally, a respective one of the plurality of first parts extends along the extension direction. Optionally, a respective one of the plurality of second parts extends along the extension direction. Optionally, the stretchable display panel comprises an insulating layer. Optionally, the insulating layer comprises a plurality of insulating blocks respectively in the plurality of first parts. Optionally, the insulating layer is at least partially absent in the respective one of the plurality of second parts.

As used herein, the term "stretchable" refers to the ability of a material, structure, device or device component to be strained in tension (e.g., being made longer anchor wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

Figure 1B:
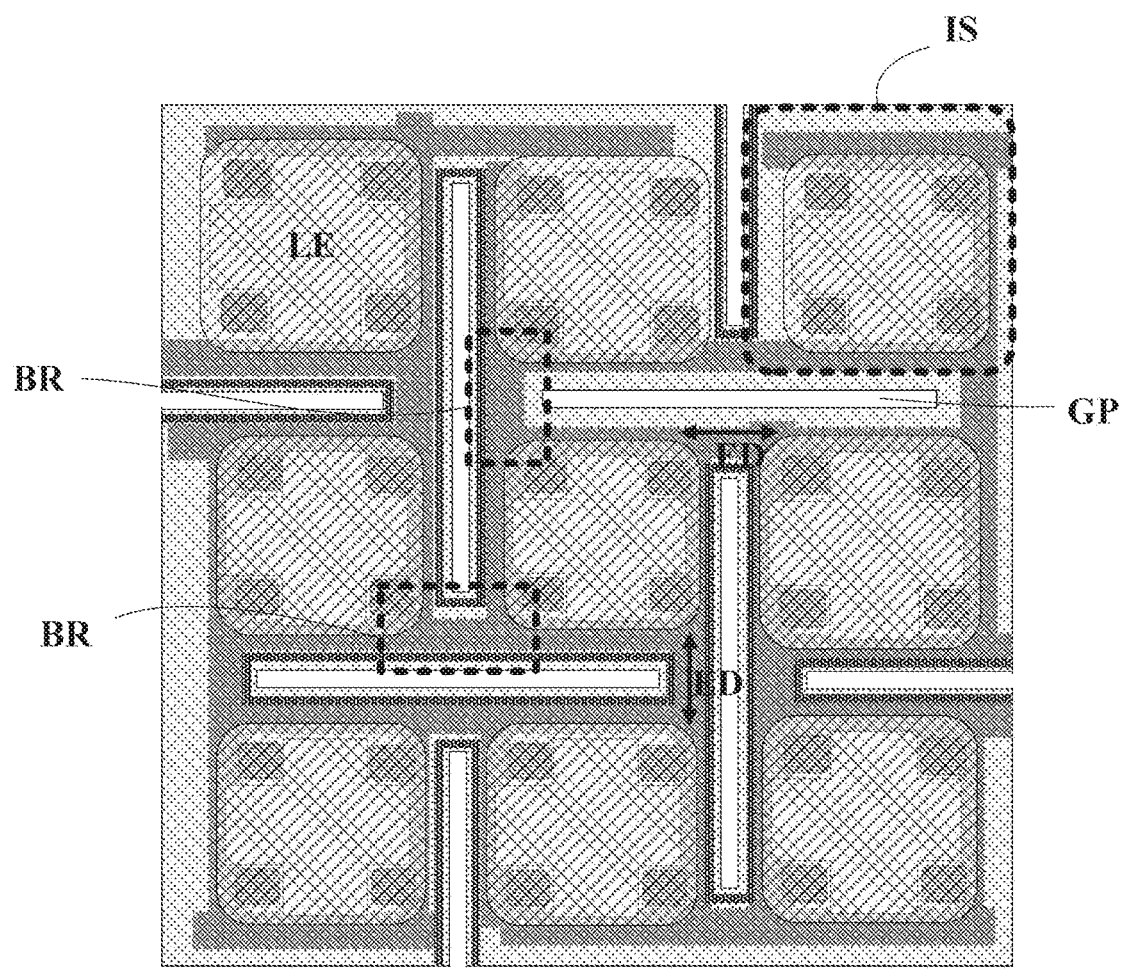
FIG. 1B is a schematic diagram illustrating the structure of a stretchable display panel in some embodiments according to the present disclosure.

FIG. 1A is a schematic diagram illustrating the structure of a stretchable display panel in some embodiments according to the present disclosure. FIG. 1B is a schematic diagram illustrating the structure of a stretchable display panel in some embodiments according to the present disclosure. Referring to FIG. 1A and FIG. 1B, in some embodiments, the stretchable display panel includes a plurality of encapsulated islands IS; and a plurality of bridges BR connecting the plurality of encapsulated islands IS. Optionally, the stretchable display panel has a plurality of gaps GP respectively between adjacent bridges of the plurality of bridges BR (or between adjacent encapsulated islands of the plurality of encapsulated islands IS, or between a bridge of the plurality of bridges BR and an encapsulated island of the plurality of encapsulated islands IS). Optionally, the plurality of gaps GP are carved-out regions in which any material (e.g., a flexible base substrate and any layer on the flexible base substrate) of the stretchable display panel is absent.

Optionally, a respective one of the plurality of encapsulated islands IS includes at least one of a plurality of light emitting elements LE encapsulated therein. Optionally, the stretchable display panel in the respective one of the plurality of encapsulated islands IS includes a single one light emitting element of the plurality of light emitting elements LE. Optionally, the stretchable display panel in the respective one of the plurality of encapsulated islands IS includes multiple light emitting elements of the plurality of light emitting elements LE. Optionally, the respective one of the plurality of encapsulated islands IS includes a red light emitting element, a green light emitting element, and a blue light emitting element of the plurality of light emitting elements LE.

Various appropriate light emitting elements may be used in the present stretchable display panel. Examples of appropriate light emitting elements include an organic light emitting diode, a quantum dots light emitting diode, and a micro light emitting diode.

As shown in FIG. 1A and FIG. 1B, a respective one of the plurality of bridges BR connects two adjacent encapsulated islands of the plurality of encapsulated islands IS along an extension direction ED from a first one of the two adjacent encapsulated islands to a second one of the two adjacent encapsulated islands. The plurality of bridges BR may have different extension directions. Optionally, the respective one of the plurality of bridges BR is substantially straight, so that the extension direction ED remains substantially the same along the length of the respective one of the plurality of bridges BR (see, e.g., FIG. 1B). Optionally, the respective one of the plurality of bridges BR is curved, so that the extension direction ED changes along the length of the respective one of the plurality of bridges BR (see, e.g., FIG. 1A).

In some embodiments, the stretchable display panel further includes a plurality of driving circuits for driving light emission of the plurality of light emitting elements LE. The plurality of driving circuits includes a plurality of thin film transistors respectively in the plurality of encapsulated islands IS and a plurality of signal lines SL in the plurality of bridges BR. The plurality of signal lines SL are configured to transmit signals into or out from a respective one of the plurality of encapsulated islands IS. Examples of the plurality of signal lines SL include gate lines, data lines, common electrode signal lines, power signal lines, clock signal lines, and so on. Optionally, the plurality of signal lines SL are a plurality of flexible signal lines. Various appropriate materials may be used for making the plurality of signal lines SL. Examples of appropriate conductive materials for making the plurality of signal lines SL include metals, alloys, graphene, carbon nanotubes, flexible conductive polymers, and other flexible conductive materials. For example, in some embodiments, the plurality of signal lines SL are made of one or a combination of a liquid metal, carbon nanotubes, graphene, and silver nanowires.

When the stretchable display panel is stretched, the plurality of bridges BR undergo a relatively large deformation as compared to the plurality of encapsulated islands IS. Due to the relatively large deformation, stress associated with the stretching process mainly exists in the plurality of bridges BR, making the plurality of bridges BR prone to fracture and line open.

In related stretchable display panel, a ratio of a width of a respective one of the plurality of bridges BR to a thickness of the respective one of the plurality of bridges BR is typically very small, e.g., less than 1:15. Due to the large difference between the width and the thickness of the respective one of the plurality of bridges BR, during the stretching process of the stretchable display panel, a non-homogeneous deformation occurs, causing distortion of the stretchable display panel so that the pixels in the plurality of encapsulated islands IS are not co-planar. This issue severely affects display quality and viewing experience. The stretchable display panel according to the present disclosure successfully obviates these issues in the related stretchable display panel.

Figure 2:
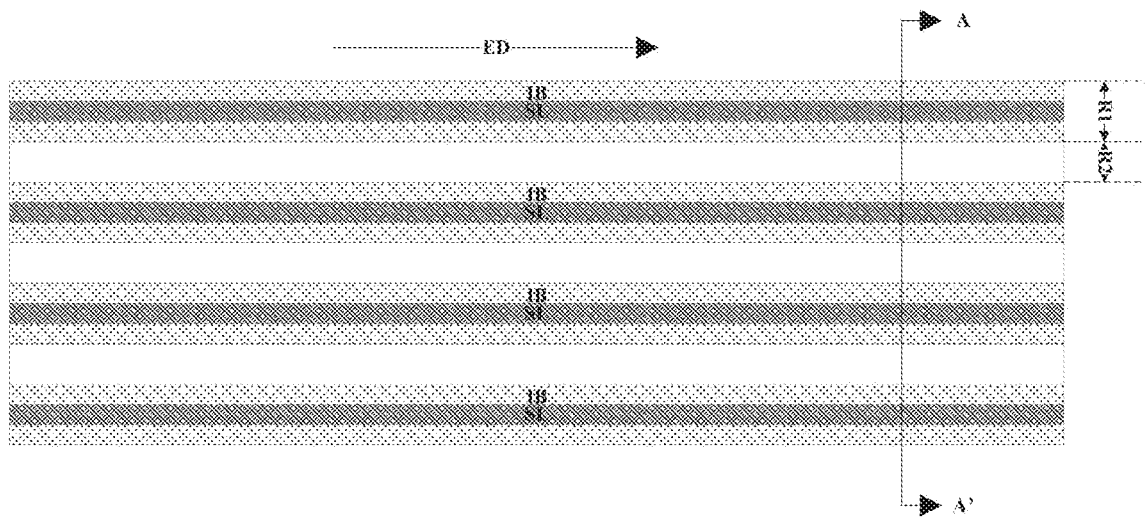
FIG. 2 is a plan view of a respective one of a plurality of bridges in a stretchable display panel in some embodiments according to the present disclosure.

FIG. 2 is a plan view of a respective one of a plurality of bridges in a stretchable display panel in some embodiments according to the present disclosure. Referring to FIG. 2, the respective one of the plurality of bridges BR includes a plurality of first parts R1 and a plurality of second parts R2 alternately arranged. A respective one of the plurality of first parts R1 extends along the extension direction ED, and a respective one of the plurality of second parts R2 extends along the extension direction ED.

FIGS. 3A to 3E are a cross-sectional views of a respective one of a plurality of bridges in a stretchable display panel in some embodiments according to the present disclosure. The cross-sectional views of FIGS. 3A to 3E may be cross-section views along, e.g., an A-A' line in FIG. 2. Referring to FIGS. 2 and 3A to 3E, in some embodiments, the stretchable display panel comprises an insulating layer IN. The insulating layer IN includes a plurality of insulating blocks IB respectively in the plurality of first parts R1. Optionally, the insulating layer IN is at least partially absent (e.g., partially removed) in the respective one of the plurality of second parts R2. In one example, the insulating layer IN is completely absent in the respective one of the plurality of second parts R2.

In some embodiments, the stretchable display panel includes a plurality of signal lines SL extending through the respective one of the plurality of bridges BR. Referring to FIGS. 3A to 3E, in some embodiments, at least one of the plurality of first parts R1 includes at least one of the plurality of signal lines SL on a respective one of the plurality of insulating blocks IB. Optionally, each of the plurality of first parts R1 includes one of the plurality of signal lines SL on a respective one of the plurality of insulating blocks M. Optionally, the plurality of signal lines SL is absent in at least one of the plurality of first parts R1. Optionally, at least one of the plurality of first parts R1 includes more than one (e.g., two) of the plurality of signal lines SL on a respective one of the plurality of insulating blocks IB. Optionally, the plurality of signal lines SL are limited in the plurality of first parts R1, and the plurality of second parts R2 are absent of the plurality of signal lines SL.

Figure 3A:
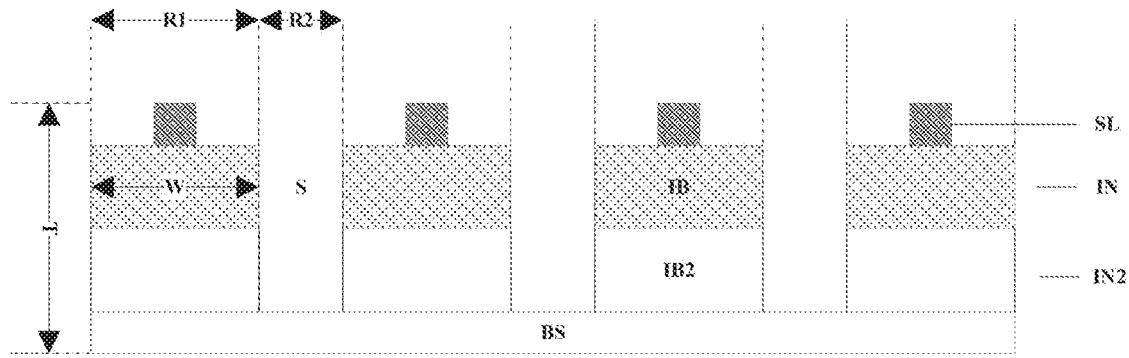
FIG. 3A is a cross-sectional view of a respective one of a plurality of bridges in a stretchable display panel in some embodiments according to the present disclosure.
Figure 3B:
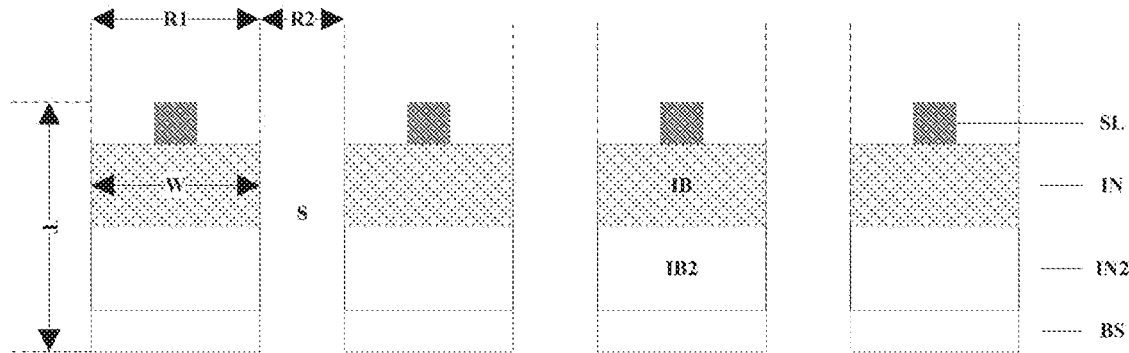
FIG. 3B is a cross-sectional view of a respective one of a plurality of bridges in a stretchable display panel in some embodiments according to the present disclosure.
Figure 3C:
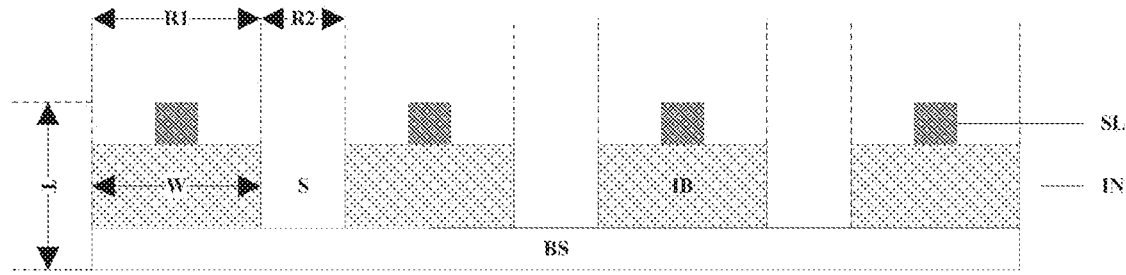
FIG. 3C is a cross-sectional view of a respective one of a plurality of bridges in a stretchable display panel in some embodiments according to the present disclosure.
Figure 3D:
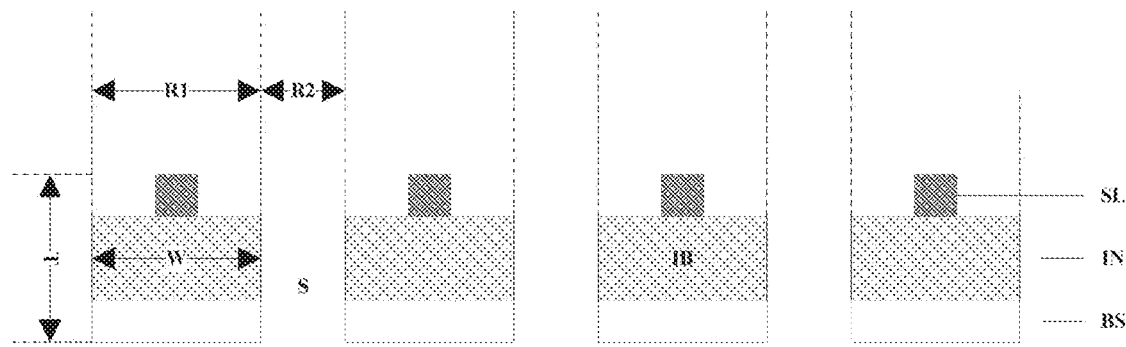
FIG. 3D is a cross-sectional view of a respective one of a plurality of bridges in a stretchable display panel in some embodiments according to the present disclosure.
Figure 3E:
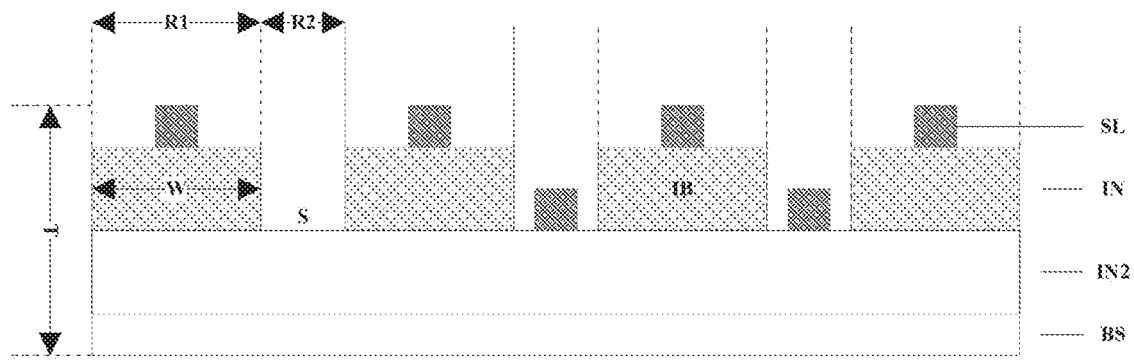
FIG. 3E is a cross-sectional view of a respective one of a plurality of bridges in a stretchable display panel in some embodiments according to the present disclosure.

Referring to FIG. 3E, in some embodiments, at least one of the plurality of second parts R2 includes at least one of the plurality of signal lines SL. Optionally, the plurality of signal lines SL is absent in at least one of the plurality of second parts R2. Optionally, each of the plurality of second parts R2 includes one of the plurality of signal lines SL, e.g., on a flexible base substrate BS (e.g., a stretchable base substrate). Optionally, at least one of the plurality of second parts R2 includes more than one (e.g., two) of the plurality of signal lines SL on the flexible base substrate BS.

Various appropriate elastomer polymer materials may be used for making the flexible base substrate BS. Examples of appropriate elastomer polymers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In some embodiments, a respective one of the plurality of first parts R1 has a width W of a cross-section along a plane intersecting the plurality of first parts R1 and the plurality of second parts R2 (e.g., the cross-sections shown in FIGS. 3A to 3E). In some embodiments, a ratio of the width W to a thickness T of the respective one of the plurality of first parts R1 is in a range of 1:10 to 10:1, e.g., 1:9 to 9:1, 1:8 to 8:1, 1:7 to 7:1, 1:6 to 6:1, 1:5 to 5:1, 1:4 to 4:1, 1:3 to 3:1, 1:2 to 2:1, 1:1.75 to 1.75:1, 1:1.5 to 1.5:1, 1:1.25 to 1.25:1, 1:1.1 to 1.1:1, or 1:1.

By having the plurality of first parts R1 and the plurality of second parts R2 alternately arranged in a respective one of the plurality of bridges BR, issues in the related stretchable display panel discussed above are obviated. First, by having the plurality of first parts R1 and the plurality of second parts R2 alternately arranged, the stress caused by the deformation can be effectively reduced, avoiding the occurrence of fracture and improving the tensile resistance of the plurality of bridges BR. Second, by removing a portion of the insulating layer IN (e.g., a barrier layer) in the plurality of second parts R2, and by disposing the plurality of signal lines in the plurality of first parts, the proportion of the rigid barrier layer in the respective one of the plurality of bridges BR decreases. This further reduces the occurrence of crack in the plurality of bridges BR. Third, the insulating layer IN may be fabricated using a relatively less rigid insulating material such as polymers and flexible inorganic insulating materials, further enhancing the flexibility of the plurality of bridges BR. Fourth, the issue of the non-homogeneous deformation in the related stretchable display panel can be obviated by reducing the difference between the width and the thickness of the respective one of the plurality of first parts R1. While the thickness of the respective one of the plurality of bridges BR remain substantially unchanged, the issue is obviated by dividing the respective one of the plurality of bridges BR into a plurality of first parts. In each of the plurality of first parts, the width and the thickness are relatively close to each other, the non-homogeneous deformation can be avoided.

In some embodiments, two adjacent insulating blocks respectively in two adjacent first parts of the plurality of first parts R1 are spaced apart from each other by a spacing S. Referring to FIGS. 3A, 3C, and 3E, in some embodiments, the spacing S is a groove, which does not extend through a thickness of the respective one of the plurality of bridges BR. For example, the stretchable display panel includes at least a flexible base substrate BS extending through regions corresponding to the plurality of first parts R1 and the plurality of second parts R2. Referring to FIG. 3C, in some embodiments, a respective one of the plurality of insulating blocks IB in the respective one of the plurality of first parts R1 is in direct contact with the flexible base substrate BS, and a surface of the flexible base substrate BS forms a bottom of the groove. Referring to FIG. 3A, in some embodiments, the respective one of the plurality of first parts R1 further includes at least a respective one of a plurality of second insulating blocks IB2 between the respective one of the plurality of insulating blocks IB and the flexible base substrate BS, the respective one of the plurality of insulating blocks IB in the respective one of the plurality of first parts R1 is in direct contact with the respective one of the plurality of second insulating blocks IB2, and a surface of the flexible base substrate BS forms a bottom of the groove. Referring to FIG. 3E, in some embodiments, the respective one of the plurality of first parts R1 further includes a second insulating layer IN2 extending through regions corresponding to the plurality of first parts R1 and the plurality of second parts R2 and between the respective one of the plurality of insulating blocks IB and the flexible base substrate BS, the respective one of the plurality of insulating blocks IB in the respective one of the plurality of first parts R1 is in direct contact with the second insulating layer IN2, and a surface of the second insulating layer IN2 forms a bottom of the groove.

Referring to FIG. 3B and FIG. 3D, in some embodiments, the spacing S is a gap extending through an entire thickness of the respective one of the plurality of bridges BR. The stretchable display panel is absent of any flexible base substrate BS in regions corresponding to the plurality of second parts R2. Referring to FIG. 3D, in some embodiments, the respective one of the plurality of insulating blocks IB in the respective one of the plurality of first parts R1 is in direct contact with the flexible base substrate BS. Referring to FIG. 3B, in some embodiments, the respective one of the plurality of first parts R1 further includes at least a respective one of a plurality of second insulating blocks IB2 between the respective one of the plurality of insulating blocks IB and the flexible base substrate BS, and the respective one of the plurality of insulating blocks IB in the respective one of the plurality of first parts R1 is in direct contact with the respective one of the plurality of second insulating blocks IB2.

Various appropriate insulating materials and various appropriate fabricating methods may be used for making the insulating layer IN and the second insulating layer IN2. For example, an insulating material may be deposited on the substrate by a plasma-enhanced chemical vapor deposition (PECVD) process and patterned. Examples of appropriate insulating materials for making the insulating layer IN and the second insulating layer IN2 include, but are not limited to, polyimide, resins, silicon oxide ($SiO_x$), silicon nitride ($SiN_y$, e.g., $Si_3N_4$), silicon oxynitride ($SiO_xN_y$).

In some embodiments, the insulating layer IN is a part of a barrier layer extending from the plurality of encapsulated islands IS into the respective one of the plurality of bridges BR. Examples of appropriate insulating materials for making the barrier layer include silicon oxide ($SiO_x$), silicon nitride ($SiN_y$, e.g., $Si_3N_4$), silicon oxynitride ($SiO_xN_y$).

Optionally, the second insulating layer IN2 is a part of a planarization layer extending from the plurality of encapsulated islands IS into the respective one of the plurality of bridges BR. Optionally, the second insulating layer IN2 is a resin layer.

In another aspect, the present disclosure provides a stretchable display apparatus including the stretchable display panel described herein or fabricated by a method described herein, and one or more driving circuits for driving image display in the stretchable display panel. Examples of appropriate stretchable display apparatuses include, but are not limited to, an electronic paper, a mobile phone, a tablet computer, a television, a monitor, a notebook computer, a digital album, a GPS, etc.

In another aspect, the present disclosure provides a method of fabricating a stretchable display panel. In some embodiments, the method includes forming a plurality of encapsulated islands; and forming a plurality of bridges connecting the plurality of encapsulated islands. Optionally, a respective one of the plurality of bridges is formed to connect two adjacent encapsulated islands of the plurality of encapsulated islands along an extension direction from a first one of the two adjacent encapsulated islands to a second one of the two adjacent encapsulated islands. Optionally, forming the respective one of the plurality of bridges includes forming a plurality of first parts and a plurality of second parts alternately arranged. Optionally, a respective one of the plurality of first parts is formed to extend along the extension direction. Optionally, a respective one of the plurality of second parts is formed to extend along the extension direction. Optionally, forming the stretchable display panel includes forming an insulating layer. Optionally, forming the insulating layer includes forming a plurality of insulating blocks respectively in the plurality of first parts. Optionally, the insulating layer is at least partially absent in the respective one of the plurality of second parts.

In some embodiments, the method includes forming a flexible base substrate on a support substrate; forming an insulating material layer on a side of the flexible base substrate away from the support substrate; forming a conductive material layer on a side of the insulating material layer away from the flexible base substrate; patterning the conductive material layer to form a plurality of signal lines in a region corresponding to the plurality of bridges, wherein a portion of the conductive material layer is removed in a region corresponding to a plurality of gaps respectively between adjacent bridges of the plurality of bridges; removing the insulating material layer in the region corresponding to the plurality of gaps; and patterning the insulating material layer to form the plurality of insulating blocks respectively in the plurality of first parts.

In some embodiments, patterning the conductive material layer is performed subsequent to forming an insulating material layer. Optionally, removing the insulating material layer in the region corresponding to the plurality of gaps and patterning the insulating material layer are performed subsequent to patterning the conductive material layer.

In some embodiments, forming the conductive material layer is performed subsequent to forming the insulating material layer, patterning the insulating material layer, and removing the insulating material layer in the region corresponding to the plurality of gaps.

In some embodiments, the method further includes forming a plurality of signal lines extending through the respective one of the plurality of bridges. Optionally, at least one of the plurality of first parts is formed to include at least one of the plurality of signal lines on a respective one of the plurality of insulating blocks. Optionally, at least one of the plurality of second parts is formed to include at least one of the plurality of signal lines. Optionally, the plurality of signal lines are formed to be limited in the plurality of first parts; and the plurality of second parts are absent of the plurality of signal lines.

In some embodiments, a respective one of the plurality of first parts is formed to have a width of a cross-section along a plane intersecting the plurality of first parts and the plurality of second parts; and a ratio of the width to a thickness of the respective one of the plurality of first parts is in a range of 1:5 to 5:1. Optionally, the ratio of width to the thickness is in a range of 1:1.5 to 1.5 to 1.

In some embodiments, two adjacent insulating blocks respectively in two adjacent first parts of the plurality of first parts are formed to be spaced apart from each other by a spacing.

In some embodiments, the spacing is a groove. Optionally, the method further includes forming a flexible base substrate extending through regions corresponding to the plurality of first parts and the plurality of second parts. Optionally, a respective one of the plurality of insulating blocks in the respective one of the plurality of first parts is formed to be in direct contact with the flexible base substrate; and a surface of the flexible base substrate forms a bottom of the groove. Optionally, forming the respective one of the plurality of first parts further includes forming at least a respective one of a plurality of second insulating blocks between the respective one of the plurality of insulating blocks and the flexible base substrate; the respective one of the plurality of insulating blocks in the respective one of the plurality of first parts is formed to be in direct contact with the respective one of the plurality of second insulating blocks; and a surface of the flexible base substrate forms a bottom of the groove.

In some embodiments, the spacing is a gap extending through an entire thickness of the respective one of the plurality of bridges. Optionally, the stretchable display panel is formed to be absent of any flexible base substrate in regions corresponding to the plurality of second parts. Optionally, the respective one of the plurality of insulating blocks in the respective one of the plurality of first parts is formed to be in direct contact with the flexible base substrate. Optionally, forming the respective one of the plurality of first parts further includes forming at least a respective one of a plurality of second insulating blocks between the respective one of the plurality of insulating blocks and the flexible base substrate; and the respective one of the plurality of insulating blocks in the respective one of the plurality of first parts is formed to be in direct contact with the respective one of the plurality of second insulating blocks.

Figure 4A:
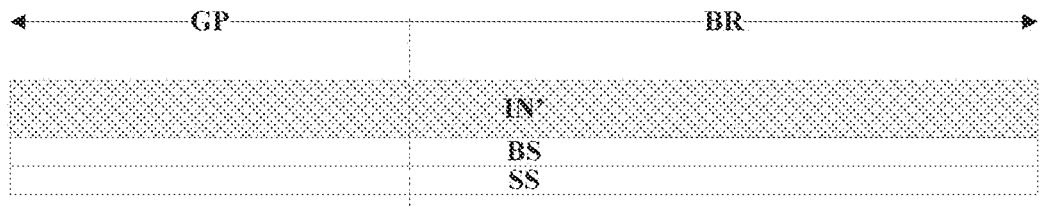
FIGS. 4A to 4F illustrate a method of fabricating a stretchable display panel in some embodiments according to the present disclosure.
Figure 4B:
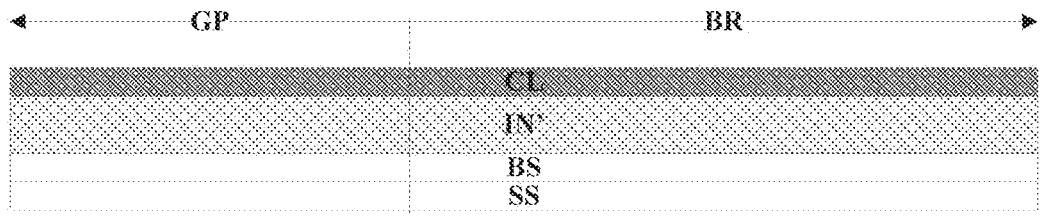

FIGS. 4A to 4F illustrate a method of fabricating a stretchable display panel in some embodiments according to the present disclosure. Referring to FIG. 4A, a flexible base substrate BS is formed on a support substrate SS (e.g., a glass support), and an insulating material layer IN' is formed on a side of the flexible base substrate BS away from the support substrate SS. The flexible base substrate BS and the insulating material layer IN' are formed in regions corresponding to the plurality of bridges BR and the plurality of gaps GP. Referring to FIG. 4B, a conductive material layer CL is formed on a side of the insulating material layer IN' away from the support substrate SS.

Figure 4C:
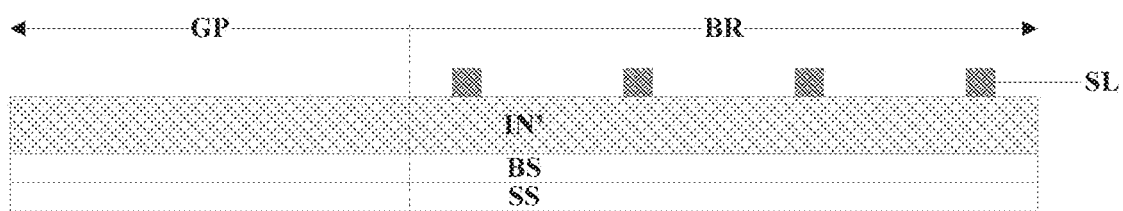

Referring to FIG. 4B and FIG. 4C, the conductive material layer CL is patterned to form a plurality of signal lines SL in a region corresponding to the plurality of bridges BR, and the conductive material layer CL is removed in a region corresponding to a plurality of gaps GP respectively between adjacent bridges of the plurality of bridges BR.

Figure 4D:
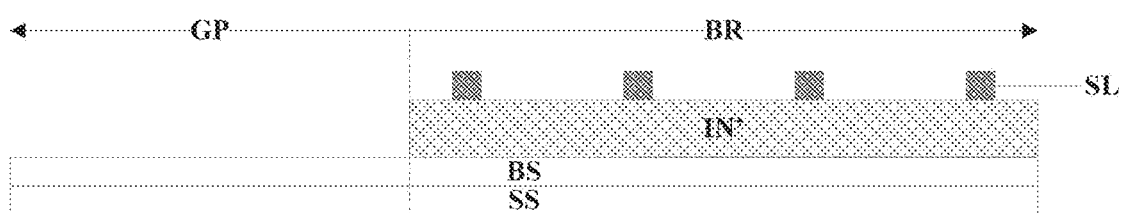

Referring to FIG. 4C and FIG. 4D, a portion of the insulating material layer IN' in the region corresponding to the plurality of gaps GP is removed.

Figure 4E:
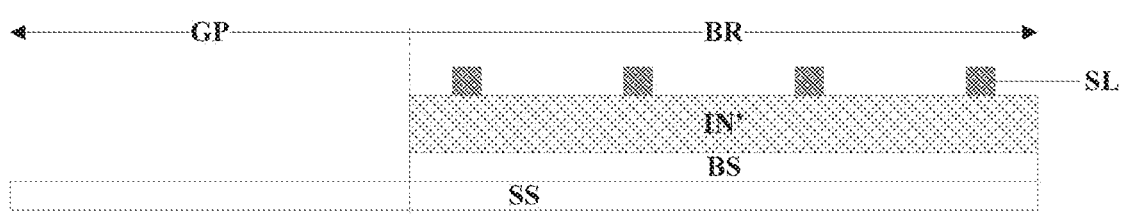

Referring to FIG. 4D and FIG. 4E, a portion of the flexible base substrate BS in the region corresponding to the plurality of gaps GP is removed.

Figure 4F:
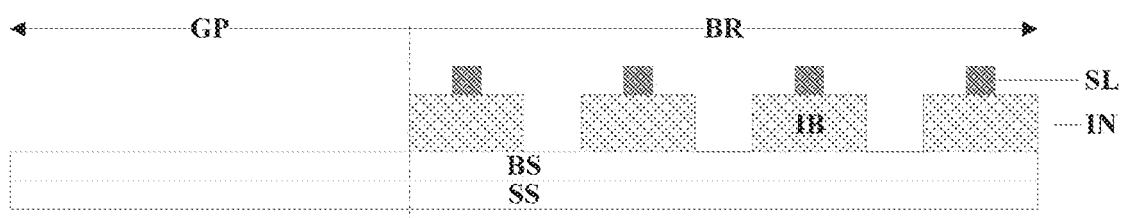

Referring to FIG. 4E and FIG. 4F, the insulating material layer IN' in a region corresponding to a respective one of the plurality of bridges BR is patterned to form a plurality of insulating blocks IB, thereby forming the plurality of first parts and the plurality of second parts alternately arranged.

Figure 5A:
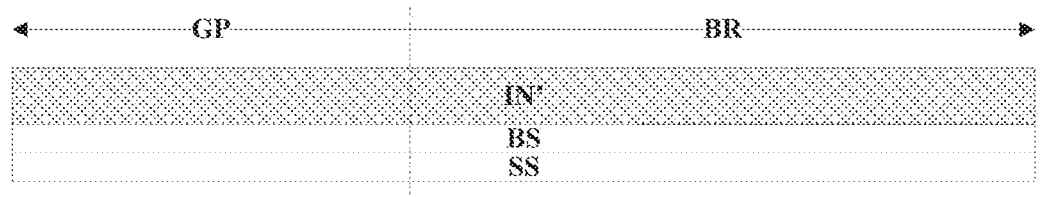
FIGS. 5A to 5F illustrate a method of fabricating a stretchable display panel in some embodiments according to the present disclosure.

FIGS. 5A to 5F illustrate a method of fabricating a stretchable display panel in some embodiments according to the present disclosure. Referring to FIG. 5A, a flexible base substrate BS is formed on a support substrate SS (e.g., a glass support), and an insulating material layer IN' is formed on a side of the flexible base substrate BS away from the support substrate SS. The flexible base substrate BS and the insulating material layer IN' are formed in regions corresponding to the plurality of bridges BR and the plurality of gaps GP.

Figure 5B:
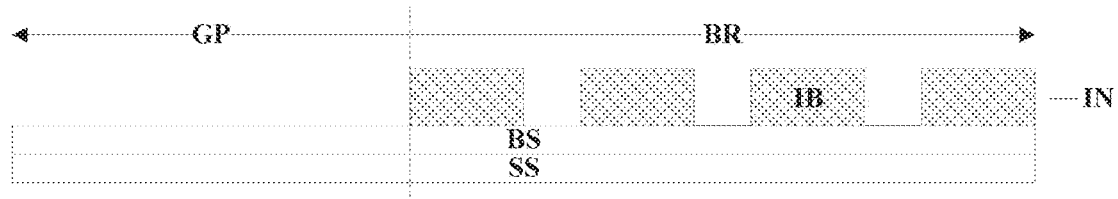

Referring to FIG. 5A and FIG. 5B, a portion of the insulating material layer IN' in the region corresponding to the plurality of gaps GP is removed; and the insulating material layer IN' in a region corresponding to a respective one of the plurality of bridges BR is patterned to form a plurality of insulating blocks IB, thereby forming the insulating layer IN.

Figure 5C:

Referring to FIG. 5B and FIG. 5C, a conductive material layer CL is formed on a side of the insulating layer IN away from the support substrate SS.

Figure 5D:
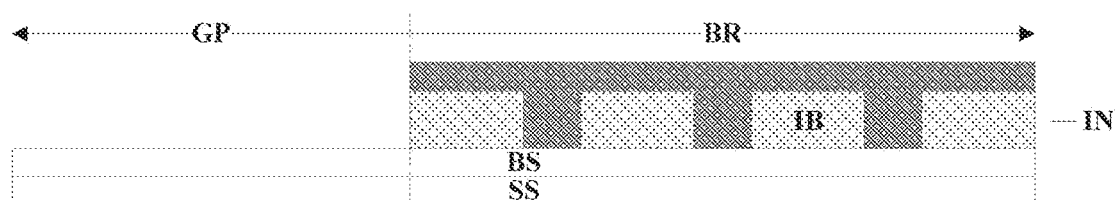

Referring to FIG. 5C and FIG. 5D, a portion of the conductive material layer CL is removed in a region corresponding to a plurality of gaps GP respectively between adjacent bridges of the plurality of bridges BR.

Figure 5E:
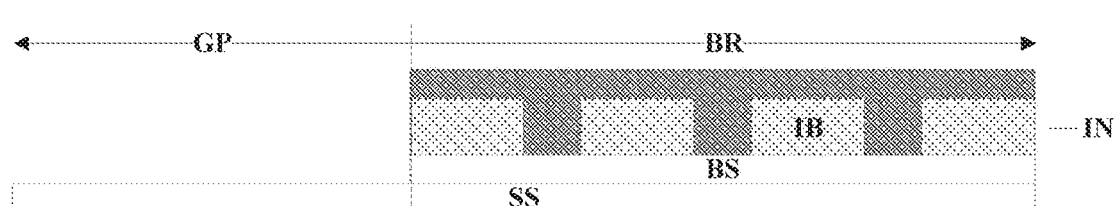

Referring to FIG. 5D and FIG. 5E, a portion of the flexible base substrate BS in the region corresponding to the plurality of gaps GP is removed.

Figure 5F:
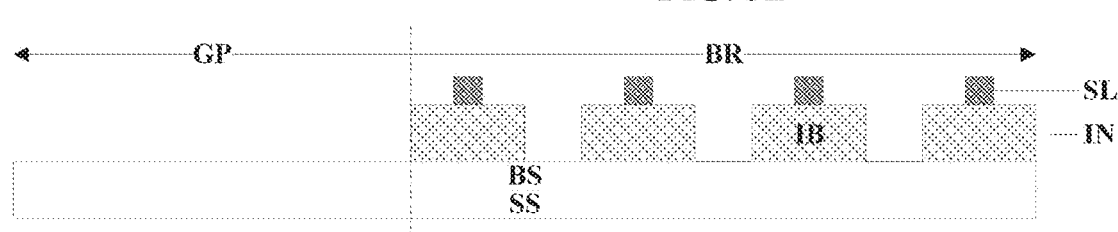

Referring to FIG. 5E and FIG. 5F, the conductive material layer CL in a region corresponding to the plurality of bridges BR is patterned to form a plurality of signal lines SL, thereby forming the plurality of first parts and the plurality of second parts alternately arranged.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stretchable display panel, comprising:
a plurality of encapsulated islands;
a plurality of bridges connecting the plurality of encapsulated islands; and
a plurality of signal lines extending through a respective one of the plurality of bridges;
wherein the respective one of the plurality of bridges connects two adjacent encapsulated islands of the plurality of encapsulated islands along an extension direction from a first one of the two adjacent encapsulated islands to a second one of the two adjacent encapsulated islands;
the respective one of the plurality of bridges comprises a plurality of first parts and a plurality of second parts alternately arranged;
a respective one of the plurality of first parts extends along the extension direction;
a respective one of the plurality of second parts extends along the extension direction;
wherein the stretchable display panel comprises an insulating layer;
the insulating layer comprises a plurality of insulating blocks respectively in the plurality of first parts;
the insulating layer is at least partially absent in the respective one of the plurality of second parts; and
at least one of the plurality of second parts comprises at least one of the plurality of signal lines.

2. The stretchable display panel of claim 1, wherein at least one of the plurality of first parts comprises at least one of the plurality of signal lines on a respective one of the plurality of insulating blocks.

3. The stretchable display panel of claim 1, wherein the plurality of signal lines are limited in the plurality of first parts; and
the plurality of second parts are absent of the plurality of signal lines.

4. The stretchable display panel of claim 1, wherein a respective one of the plurality of first parts has a width of a cross-section along a plane intersecting the plurality of first parts and the plurality of second parts; and
a ratio of the width to a thickness of the respective one of the plurality of first parts is in a range of 1:5 to 5:1.

5. The stretchable display panel of claim 4, wherein the ratio of width to the thickness is in a range of 1:1.5 to 1.5:1.

6. The stretchable display panel of claim 1, wherein two adjacent insulating blocks respectively in two adjacent first parts of the plurality of first parts are spaced apart from each other by a spacing.

7. The stretchable display panel of claim 6, wherein the spacing is a groove; and
the stretchable display panel comprises a flexible base substrate extending through regions corresponding to the plurality of first parts and the plurality of second parts.

8. The stretchable display panel of claim 7, wherein a respective one of the plurality of insulating blocks in the respective one of the plurality of first parts is in direct contact with the flexible base substrate; and
a surface of the flexible base substrate forms a bottom of the groove.

9. The stretchable display panel of claim 7, wherein the respective one of the plurality of first parts further comprises at least a respective one of a plurality of second insulating blocks between the respective one of the plurality of insulating blocks and the flexible base substrate;
the respective one of the plurality of insulating blocks in the respective one of the plurality of first parts is in direct contact with the respective one of the plurality of second insulating blocks; and
a surface of the respective one of the flexible base substrate forms a bottom of the groove.

10. The stretchable display panel of claim 6, wherein the spacing is a gap extending through an entire thickness of the respective one of the plurality of bridges; and
the stretchable display panel is absent of any flexible base substrate in regions corresponding to the plurality of second parts.

11. The stretchable display panel of claim 10, wherein the respective one of the plurality of insulating blocks in the respective one of the plurality of first parts is in direct contact with a flexible base substrate.

12. The stretchable display panel of claim 10, wherein the respective one of the plurality of first parts further comprises at least a respective one of a plurality of second insulating blocks between the respective one of the plurality of insulating blocks and a flexible base substrate; and
the respective one of the plurality of insulating blocks in the respective one of the plurality of first parts is in direct contact with the respective one of the plurality of second insulating blocks.

13. A stretchable display panel, comprising:
a plurality of encapsulated islands; and
a plurality of bridges connecting the plurality of encapsulated islands;
wherein a respective one of the plurality of bridges connects two adjacent encapsulated islands of the plurality of encapsulated islands along an extension direction from a first one of the two adjacent encapsulated islands to a second one of the two adjacent encapsulated islands;
the respective one of the plurality of bridges comprises a plurality of first parts and a plurality of second parts alternately arranged;
a respective one of the plurality of first parts extends along the extension direction;
a respective one of the plurality of second parts extends along the extension direction;
wherein the stretchable display panel comprises an insulating layer;
the insulating layer comprises a plurality of insulating blocks respectively in the plurality of first parts; and
the insulating layer is at least partially absent in the respective one of the plurality of second parts;
wherein the insulating layer is a part of a barrier layer extending from the plurality of encapsulated islands into the respective one of the plurality of bridges.

14. A display apparatus, comprising the stretchable display panel of claim 1, and one or more integrated circuits connected to the stretchable display panel.

15. A method of fabricating a stretchable display panel, comprising:
forming a plurality of encapsulated islands; and
forming a plurality of bridges connecting the plurality of encapsulated islands;
wherein a respective one of the plurality of bridges is formed to connect two adjacent encapsulated islands of the plurality of encapsulated islands along an extension direction from a first one of the two adjacent encapsulated islands to a second one of the two adjacent encapsulated islands;
forming the respective one of the plurality of bridges comprises forming a plurality of first parts and a plurality of second parts alternately arranged;
a respective one of the plurality of first parts is formed to extend along the extension direction;
a respective one of the plurality of second parts is formed to extend along the extension direction;
wherein forming the stretchable display panel comprises forming an insulating layer;
forming the insulating layer comprises forming a plurality of insulating blocks respectively in the plurality of first parts; and
the insulating layer is at least partially absent in the respective one of the plurality of second parts;
wherein the method further comprises:
forming a flexible base substrate on a support substrate;
forming an insulating material layer on a side of the flexible base substrate away from the support substrate;
forming a conductive material layer on a side of the insulating material layer away from the flexible base substrate;
patterning the conductive material layer to form a plurality of signal lines in a region corresponding to the plurality of bridges, wherein a portion of the conductive material layer is removed in a region corresponding to a plurality of gaps respectively between adjacent bridges of the plurality of bridges;
removing the insulating material layer in the region corresponding to the plurality of gaps; and
patterning the insulating material layer to form the plurality of insulating blocks respectively in the plurality of first parts.

16. The method of claim 15, wherein patterning the conductive material layer is performed subsequent to forming an insulating material layer; and
removing the insulating material layer in the region corresponding to the plurality of gaps and patterning the insulating material layer are performed subsequent to patterning the conductive material layer.

17. The method of claim 15, wherein forming the conductive material layer is performed subsequent to forming the insulating material layer, patterning the insulating material layer, and removing the insulating material layer in the region corresponding to the plurality of gaps.

* * * * *